United States Patent
Ustinov et al.

(10) Patent No.: US 6,627,915 B1
(45) Date of Patent: Sep. 30, 2003

(54) SHAPED JOSEPHSON JUNCTION QUBITS

(75) Inventors: Alexey V. Ustinov, Effeltrich (DE); Andreas Walraff, Erlangen (DE); Yu Koval, Erlangen (DE)

(73) Assignee: D-Wave Systems, Inc., Vancouver (CA)

( * ) Notice: Subject to any disclaimer, the term of this patent is extended or adjusted under 35 U.S.C. 154(b) by 77 days.

(21) Appl. No.: 09/637,514

(22) Filed: Aug. 11, 2000

(51) Int. Cl.$^7$ ................................................ H01L 29/06
(52) U.S. Cl. ........................... 257/31; 257/30; 257/33; 257/35; 438/2
(58) Field of Search ........................... 257/30–36; 438/2

(56) References Cited

U.S. PATENT DOCUMENTS

| | | | |
|---|---|---|---|
| 3,936,677 A | 2/1976 | Fulton et al. | 307/306 |
| 4,181,902 A * | 1/1980 | Scott | 331/107 S |
| 4,749,888 A | 6/1988 | Sakai et al. | 326/4 |
| 5,323,344 A | 6/1994 | Katayama et al. | 365/162 |
| 5,560,836 A | 10/1996 | Nagaishi | 216/3 |
| 5,683,967 A * | 11/1997 | Frenkel | 505/320 |
| 5,768,297 A | 6/1998 | Shor | 371/40.11 |
| 5,793,091 A | 8/1998 | Devoe | 257/432 |
| 5,917,322 A | 6/1999 | Gershenfeld et al. | 324/307 |
| 6,301,029 B1 | 10/2001 | Azuma | 359/107 |
| 6,317,766 B1 | 11/2001 | Grover | 708/400 |
| 6,331,805 B1 * | 12/2001 | Gupta et al. | 331/107 S |

FOREIGN PATENT DOCUMENTS

| | | | |
|---|---|---|---|
| JP | 60 170275 | 9/1985 | H01L/39/22 |
| JP | 5190922 A2 | 7/1993 | H01L/39/22 |
| WO | WO 02/15290 A1 | 2/2002 | H01L/39/22 |

OTHER PUBLICATIONS

D. Averin, "Quantum Computation: Solid–state qubits under control", Nature 398, pp. 748–752 (Apr. 29, 1999).

C. Bennett, and D. DiVincenzo, "Quantum Information and Computation", Nature 404, pp. 247–255 (Mar. 16, 2000).

F. Benatti, et al., "Testing Macroscopic Quantum Coherence", IL Nuovo Cimento B 110, N. 5–6, pp. 593–610 (Jan. 19, 1995).

M. Bocko, et al., "Prospects for quantum coherent computation using superconducting electronics", IEEE Transactions on Applied Superconductivity 7, 3638 (Jun. 1, 1997).

J. Caputo, "Effect of geometry on fluxon width in a Josephson junction", International Journal of Modern Physics C 7(2), 191 (996).

M. Castellano, et al., "Thermally activated escape from the zero–voltage state in long Josephson junctions", Physical Review B, 54(21), 15417 (Dec. 1, 1996).

L. Chiatti, et al., "Is Macroscopic Quantum Coherence Incompatible with Macroscopic Realism?", IL Nuovo Cimento B 110, N. 5–6, pp. 585–591 (Jan. 19, 1995).

M. Cirillo et al., "Dynamical evidence of critical fields in Josephson junctions", PRB, 56, 11889 (Nov. 1, 1997).

(List continued on next page.)

*Primary Examiner*—Nathan J. Flynn
*Assistant Examiner*—Scott R. Wilson
(74) *Attorney, Agent, or Firm*—Pennie & Edmonds LLP

(57) ABSTRACT

A superconducting qubit is presented. The qubit is a shaped long Josephson junction with a magnetic fluxon such that, in the presence of an externally applied magnetic field, a fluxon potential energy function indicating a plurality of pinning sites in the qubit is produced. In one embodiment, a heart-shaped Josephson junction is formed where a trapped fluxon has a double-welled potential energy function, indicating two pinning sites, when the junction is placed in an externally applied magnetic field. The qubit is manipulated by preparing an initial state, creating a superposition of the two states by decreasing the magnetic field, evolving of the quantum state with time, freezing in a final state by increasing the magnetic field, and reading out the final state. In other embodiments, qubit exhibiting potential energy functions having any number of pinning sites can be realized.

22 Claims, 11 Drawing Sheets

OTHER PUBLICATIONS

I. Chuang, et al., "Experimental realization of a quantum algorithm", Nature, 393, 143 (May 14, 1998).

A. Davidson et al., "Experiments on soliton motion in annular Josephson junctions", Journal Applied Physics 60, 1447 (Aug. 1, 1986).

A. Davidson et al., "Experimental investigation of trapped Sine–Gordon solitons", Physical Review Letters 55, 2059 (Nov. 4, 1985).

D. DiVencenzo, "Two–bit universal for quantum computation", Physical Review A 51(2), 1015 (Feb. 1, 1995).

D. DiVincenzo, "Quantum computation", Science, 270, 255 (Oct. 13, 1995).

David P. DiVincenzo, "The Physical Implementation of Quantum Computation", in *Scalable Quatnum Computers: Paving the Way to Realization* (S. Braunstein et al. eds., Wiley–VCH Verlag, 2001).

T. Drose, and C. Morais–Smith, "Metastability in Josephson transmission lines", Physical Review B 61, 1506 (2000).

R. Fazio et al., "Fidelity and leakage of Josephson qubits", LANL cond–mat/9906292, (Jun. 18, 1999).

Marc Feldman, "Josephson Junctions Digital Circuits—Challenges s and Opportunities", [published in Japanese] in FED Review, FED Superconducting Project: Josephson Device Hybrid System (FED, Tokyo, 1998) pp. 23–46. [This manuscript was submitted in English (Jan. 2, 1998) for Translation to Japanese.]

A. Filippov, et al., "Critical currents in Josephson junctions with microinhomogeneities attracting solitons", Physics Letters A 120, 47 (1987).

M. Fistul, et al., "Escape of a Josephson vortex trapped in an annular Josephson junction", Physica B, 284–288, 585–586 (2000).

A. Franz, et al., "Magnetic field penetration in a long Josephson junction imbedded in a wide stripline", Journal Applied Physics 89, 471 (2000).

A. Franz, et al., "Measurements of the critical current diffraction patterns in annular Josephson junctions", Physical Review B 62(1), 119 (Jul. 1, 2000).

J. Friedman, et al., "Quantum super–position of distinct macroscopic states", Nature 406, 43 (Jul. 6, 2000).

Z. Hermon, et al., "Dephasing length and coherence of a quantum soliton in an ideal long Josephson junction", Physical Review Letters 74(24), 4915 (Jun. 12, 1995).

L. Ioffe et al., "Environmentally decoupled sds–wave junction for quantum computing", Nature, 398, 679 (Apr. 29, 1999).

T. Kato, and M. Imada, "Macroscopic quantum tunneling of a fluxon in a long–Josephson junction", Journal Physical Society Japan 65(9), 2963 (Sep. 1, 1996).

S. Keil, et al., "Magnetic flux pinning in annular Josephson junctions in a barrier parallel dc magnetic field", Physical Review B 54(21), 14948 (Dec. 1, 1996).

A. Kemp, et al., "Critical current diffraction patterns for annular Josephson junctions in dependence of the direction of the field", Conference on Future Perspectives of Superconducting Josephson Devices, Acquafredda di Maratea, Italy, (Jul. 1, 2000).

Y. Kivshar, and B. Malomed, "Interaction of a fluxon with a local inhomogeniety in a long Josephson junction", Physics Letters A 129, 443 (Jun. 1, 1988).

A. Korotkov, "Correlated quantum measurement of a solid state qubit", LANL pre–print cond–mat/0008003 (Aug. 1, 2000).

Yu. Koval, et al., "Narrow long Josephson junctions", IEEE Transactions on Applied Superconductivity 9, 3957 (1999).

S. Lloyd, "Almost any quantum logic gate is universal", Physical Review Letters 75, 346 (Jul. 10, 1995).

Y. Makhlim et al., "Josephson–junction qubits in controlled couplings", Nature, 398, 305 (Mar. 25, 2999).

B. Malmod, "Dynamics of a fluxon in a long Josephson junction with a periodic lattice of inhomogeneities", Physical Review B 38, 9242 (Nov. 1, 1988).

B. Malomed, and A. Ustinov, "Analysis of testing the single–fluxon dynamics in a long Josephson junction by a disspative spot", Physical Review B 49, 13024 (May 1, 1994).

N. Martucciello, and R. Monaco, "Annular Josephson tunnel junctions in an external magnetic field: the staics", Physical Review B 53(6), 3471 (Feb. 1, 1996).

N. Martucciello, et al., "Annular Josephson tunnel junctions in external magnetic field: the dynamics", Physical Review B 55(22), 15157 (Jun. 1, 1997).

N. Martucciello, et al., "Fluxon dynamics in long annular Josephson tunnel junctions", Physical Review B 57(9), 5444 (Mar. 1, 1998).

J. Mooij, et al., "Josephson persistent–current qubits", Science, 285, 1036 (Aug. 13, 1999).

D. Munter, et al., "Fluxon pinning through interaction with the superconducting wiring of long annular Josephson junctions", Physical Review B 58, 14518 (Dec. 1, 1998).

C. Myatt, et al., "Decoherence of quantum superpositions through coupling to engineered reservoirs", Nature, 403, 269 (Jan. 20, 2000).

Y. Nakamura, et al., "Coherent control of macroscopic quantum states in a single–Cooper–pair box", Nature 398, 786 (Apr. 29, 1999).

C. Nappi, et al., "Fiske steps in annular Josephson junctions with trapped flux quanta", Physical Review B 58(17), 11685 (Nov. 1, 1998).

C. Nappi, "Critical–current diffraction pattern of annular Josephson junctions", Physical Review B 55(1), 82 (1997).

K. Neurohr et al., "Local suppression of J. currents in niobium / 2–D e– gas / niobium structures by an injection current", Physical Review B 59, 11197 (May 1, 1999).

T. Orlando, et al., "A superconducting persistent current qubit", Physical Review B 60, 15398 (Dec. 1, 1999).

N. Pederson, "Fluxon electronic devices", IEEE Transactions Magnetics 27, 3328 (Mar. 1, 1991).

H. Pressler, "Fluxon bunching in Josephson tunnel junctions", Physics Letters A 244, pp. 149–154 (Jul. 13, 1998).

A. Shnirman et al., "Tunneling and resonant tunneling of fluxons in a long Josephson junction", Physical Review B 56, 14677 (Dec. 1, 1997).

A. Ustinov, et al., "Soliton trapping in a harmonic potential: experiment", Physics Letters A 233, 239 (1997).

A. Ustinov, and N. Thyssen, "Experimental study of fluxon dynamics in a harmonic potential well", Journal of Low Temperature Physics 106, 193 (1997).

A. Ustinov, et al., "Dynamics of sine–Gordon solitons in the annular Josephson–junction", Physical Review Letters 69(12), 1815 (1992).

A. Ustinov, "Solitons in Josephson junctions", Physica D 123, 315 (1998).

I. Vernik, et al., "Observation of supersoliton resonances in the modulated annular Josephson junction", Physics Letters A 168, 319 (1992).

I. Vernik, et al., "Fluxon pinning in annular Josephson junctions by an external magnetic field", Journal Applied Physics 81(3), 1335 (1997).

I. Vernik et al., "Soliton bunching in annular Josephson junctions", Journal Applied Physics 79, 7854 (May 1, 1996).

A. Vystavkin, et al., "First observation of static bound states of fluxons in long josephson junctions with inhomogeneities", Soviet Journal Low Temperature Physics 14, 357 (Jun. 1, 1988).

A. Wallraff, "Fluxon Dynamics in annular Josephson junctions: From relativistic strings to quantum particles", PhD thesis, Chapter 7, University of Erlangen–Nurnberg, Germany, (2000).

Wallraff et al., "Annular Long Josephson Junctions in a Magnetic Field: Engineering and Probing the Fluxon Interaction Potential", Journal of Low Temperature Physics, vol. 118 Nos. 5/6 p. 543–553, Mar. 2000.*

Wallraff, "Fluxon Dynamics in Annular Josephson Junctions: From Relativistic Strings to Quantum Particles", Chapter 8, Universität Erlangen–Nürnberg, Jun. 2000.*

Wallraff, A. et al.: "Annular Long Josephson Junctions in a Magnetic Field: Engineering and Probing the Fluxon Interaction Potential" International Conference on Electron Transport in Mesoscopic Systems, ETMS '99, Goteborg, Sweden, Aug. 12–15, 1999, vol. 118, No. 5–6, pp. 543–553, XP001050511, Journal of Low Temperature Physics, Mar. 2000, Kluwer Academic/Plenum Publishers, USA, ISSN: 0022–2291.

* cited by examiner

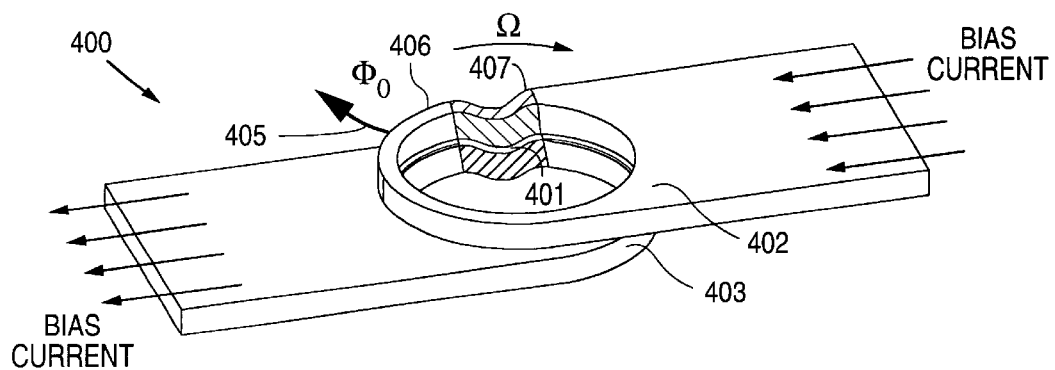
FIG. 4a
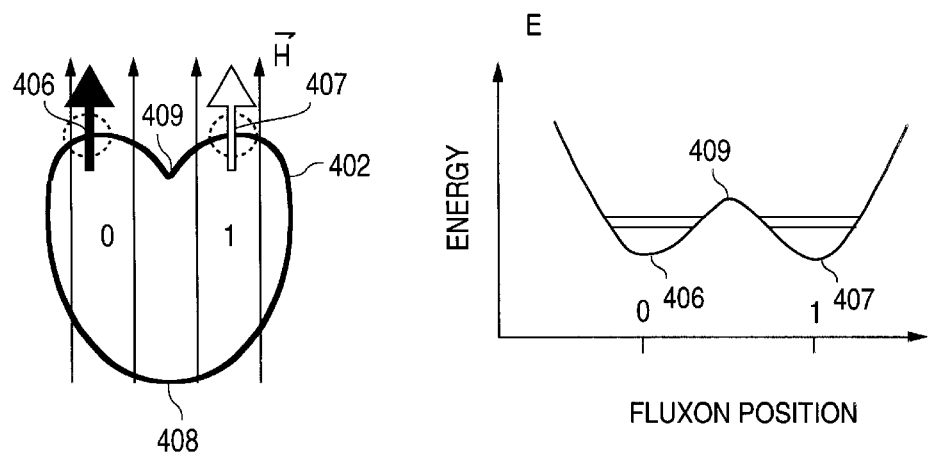
FIG. 4b  FIG. 4c

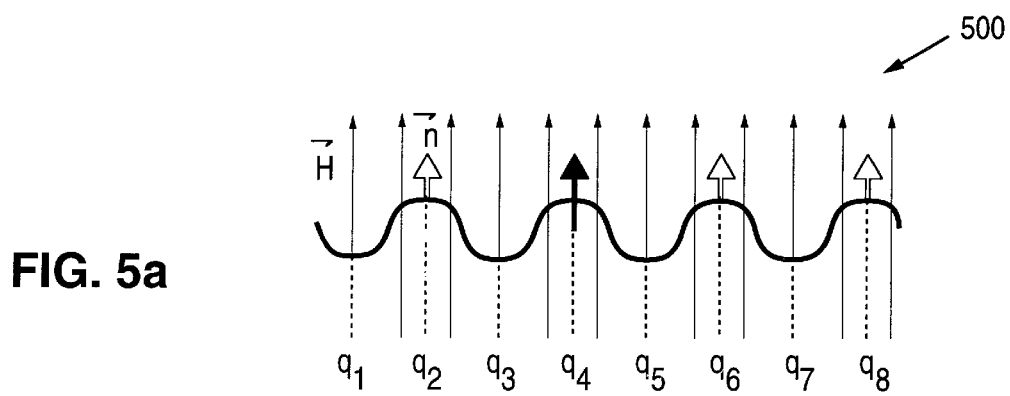
FIG. 5a
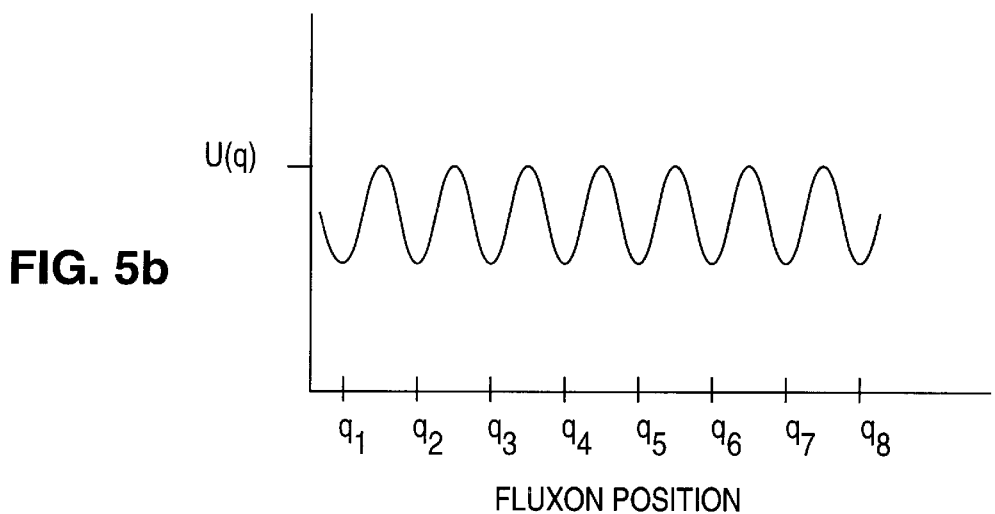
FIG. 5b
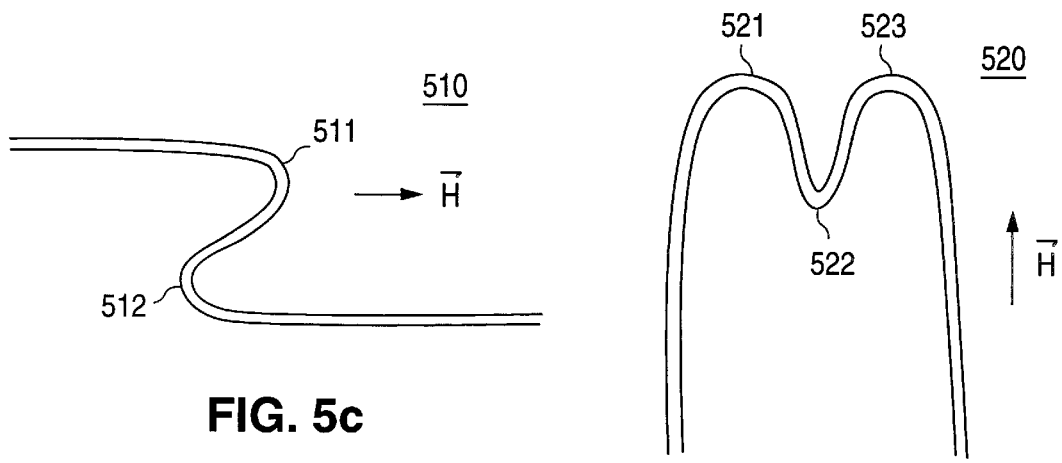
FIG. 5c
FIG. 5d

SHAPED JOSEPHSON JUNCTION QUBITS

BACKGROUND

1. Field of the Invention

This invention relates to quantum computing and to solid state devices that use superconducting materials to create and maintain coherent quantum states such as are required for quantum computing.

2. Description of Related Art

The field of quantum computing has generated interest in physical systems capable of performing quantum calculations. Such systems should allow the formation of well-controlled and confined quantum states. The superposition of these quantum states are then suitable for performing quantum computation. The difficulty is that microscopic quantum objects are typically very difficult to control and manipulate. Therefore, their integration into the complex circuits required for quantum computations is a difficult task.

Research on what is now called quantum computing traces back to Richard Feynman, [R. Feynman, Int. J. Theor. Phys., 21, 467–488 (1982)]. Feynman noted that quantum systems are inherently difficult to simulate with conventional computers but that observing the evolution of a quantum system could provide a much faster way to solve some computational problems.

Further efforts in quantum computing were initially concentrated on "software development" or building of the formal theory of quantum computing. Milestones in these efforts were the discoveries of the Shor and Grover algorithms. [See P. Shor, SIAM J. of Comput., 26:5, 1484–1509 (1997); L. Grover, Proc. 28th STOC, 212–219 (1996); and A. Kitaev, LANL preprint quant-ph/9511026 (1995)]. In particular, the Shor algorithm permits a quantum computer to factorize natural numbers. The showing that fault-tolerant quantum computation is theoretically possible opened the way for attempts at practical realizations of quantum computers. [See E. Knill, R. Laflamme, and W. Zurek, Science, 279, p. 342 (1998).]

One proposed application of a quantum computer is factoring of large numbers. In such an application, a quantum computer could render obsolete all existing encryption schemes that use the "public key" method. In other applications, quantum computers (or even a smaller scale device, a quantum repeater) could allow absolutely safe communication channels where a message, in principle, cannot be intercepted without being destroyed in the process. [See H. J. Briegel et al., LANL preprint quant-ph/9803056 (1998) and the references therein.]

Quantum computing generally involves initializing the states of N qubits (quantum bits), creating controlled entanglements among the N qubits, allowing the quantum states of the qubits to evolve under the influence of the entanglements, and reading the qubits after they have evolved. A qubit is conventionally a system having two degenerate quantum states, and the initial state of the qubit typically has non-zero probabilities of being found in either degenerate state. Thus, N qubits define an initial state that is a combination of $2^N$ degenerate states. The entanglements control the evolution of the distinguishable quantum states and define calculations that the evolution of the quantum states performs. This evolution, in effect, performs $2^N$ simultaneous calculations. Reading the qubits after evolution is complete determines the states of the qubits and the results of the calculations.

Several physical systems have been proposed for the qubits in a quantum computer. One system uses chemicals having degenerate spin states. Nuclear magnetic resonance (NMR) techniques can read the spin states. These systems have successfully implemented the Shor algorithm for factoring of a natural number (15). However, efforts to expand such systems up to a commercially useful number of qubits face difficult challenges.

Another physical system for implementing a qubit includes a superconducting reservoir, a superconducting island, and a Josephson junction that can transmit a Cooper pair (of electrons) from the reservoir into the island. The island has two degenerate states. One state is electrically neutral, but the other state has an extra Cooper pair on the island. A problem with this system is that the charge of the island in the state having the extra Cooper pair causes long range electric interactions that interfere with the coherence of the state of the qubit. The electric interactions can force the island into a state that definitely has or lacks an extra Cooper pair. Accordingly, the electric interactions can end the evolution of the state before calculations are complete or qubits are read. This phenomenon is commonly referred to as collapsing the wavefunction, loss of coherence, or decoherence.

Another macroscopic alternative to microscopic quantum objects relies on superconducting line structures containing Josephson junctions. Superconductivity is a macroscopically coherent quantum phenomenon and therefore superconducting systems are attractive candidates for utilization in quantum computing circuits.

FIG. 1a shows an example of a Josephson junction 110 in a SQUID qubit 100. A Josephson junction refers to two superconducting electrodes separated by a thin tunnel barrier formed by a dielectric. FIG. 1a shows a SQUID (superconduction quantum interference device) qubit 100. Qubit 100 has a continous superconducting loop 101 with endpoints separated by a gap to form junction 110. Junction 110 is filled with a thin dielectric forming a potential barrier between the endpoints of line 101. A quantum superposition of magnetic flux states in the superconducting loop containing Josephson junction 101, qubit 100, is called macroscopic quantum coherence (MQC).

If an external magnetic field applied to qubit 100 provides a magnetic flux equal to one half the magnetic flux quantum, $\Phi_0/2$, then the potential energy presented by the magnetic flux ($\Phi_{int}$) states of qubit 100 has two symmetric minima as is shown in FIG. 1b. A magnetic flux trapped in qubit 100 can then tunnel between the two symmetric minima of the magnetic flux potential energy function. The degenerate ground states of a magnetic flux in qubit 100 are linear combinations of the states corresponding to the minima of the potential energy function (i.e. $|0>+|1>$ and $|0>-|1>$). These degenerate states are split by the energy difference related to the tunneling matrix element. Therefore, if the coherence can be maintained long enough, the magnetic flux will quantum-mechanically oscillate back and forth between the two degenerate states.

The drawback of qubit 100 is that it is an open system and transition from one potential well to another is accompanied by the inversion of the magnetic field and superconducting screening currents surrounding qubit 100. The energy of this redistribution and the unknown external influences can be relatively large and can therefore cause decoherence (i.e., collapsing of the quantum mechanical wave functions). Moreover, the potential energy barrier, and therefore the energy split between the two degenerated states, cannot be controlled in situ, unless the Josephson junction is substituted by a small SQUID with independently-tunable critical current.

There is a continuing need for a structure for implementing a quantum computer. Further, there is a need for a structure having a sufficient number of qubits to perform useful calculations.

SUMMARY

In accordance with the present invention, a qubit having a shaped long Josephson junction which can trap fluxons is presented. A qubit according to the present invention can offer a well-isolated system that allows independent control over the potential energy profile of a magnetic fluxon trapped on the qubit and dissipation of fluxons. Additionally, shaped long Josephson junctions can have shapes resulting in nearly any arbitrary desired potential energy function for a magnetic fluxon trapped on the junction.

Therefore, a superconducting qubit according to the present invention includes a long Josephson junction having a shape such as to produce a selected potential energy function indicating a plurality of pinning locations for a trapped fluxon in the presence of an externally applied magnetic field.

In one embodiment, the qubit has a heart-shaped long Josephson junction. The heart-shaped junction, in an external magnetic field applied in the plane of the Josephson junction and along a direction that the two lobes of the heart-shape are symmetric about (i.e., the symmetry axis of the heart), provides a spatially symmetric double-well potential energy function for pinning a trapped fluxon in one of the two lobes of the heart shape. The height of the potential barrier between the wells is controlled by the magnitude of the applied magnetic field. A non-symmetric double-welled potential energy function can be created by distorting the symmetry of the two lobes physically (i.e., distorting the "heart-shape" of the shaped Josephson junction). Additionally, the double-welled potential energy function can be altered in a controlled way by rotating the externally applied magnetic field in the plane of the Josephson junction and by applying a bias current.

A fluxon trapped on a heart-shaped junction will have a magnetic-field dependent potential energy function with minima on each of the two lobes, where the magnetic moment of the fluxon is aligned with the direction of the applied magnetic field in the plane of the junction. Pinning locations for fluxons are therefore created on each of the lobes of the heart-shaped junction. Fluxons can be trapped on the junction by applying a small bias current through the junction while the temperature of the superconductors forming the junction is lowered through the superconducting transition temperature. The potential energy function can then be controlled by rotating the magnetic field in the plane of the junction and by adjusting a small bias current through the junction. Additionally, the height of the potential well barrier between the two minima in the potential energy function is determined by the strength of the externally applied magnetic field.

In a second embodiment, a qubit having a spatially periodic potential well function is formed by a long Josephson junction shaped like a sine wave. When a magnetic field is applied in the plane of the sine-wave shaped junction, a periodic potential well function is formed. As before, the magnetic portion of the potential energy function is a minimum when the magnetic moment of the trapped fluxon traveling on the junction is aligned with the externally applied magnetic field in the plane of the junction and is a maximum when the magnetic moment has its maximum angle with the externally applied magnetic field. Pinning locations, therefore, are formed wherever the potential energy function is minimum. Again, variations of the potential energy function of a fluxon on the qubit can be altered by the bias current and the strength and direction of the externally applied magnetic field.

In a third embodiment, a qubit includes an S-shaped or M-shaped long Josephson junction. Again, the potential energy function of a trapped fluxon in the junction is a minimum where the angle between the magnetic moment of the fluxon and an externally applied magnetic field is a minimum.

The final state of a qubit according to the present invention can be determined by placing small, weakly coupled SQUID detectors in proximity to the pinning locations on the qubit. Alternatively, the final state of a qubit according to the present invention can be determined by measuring the escape current that, in general, is different for different pinning locations on the shaped long Josephson junction.

Entaglements can be formed between qubits made from long Josephson junctions by placing the Josephson junctions proximate one another so that a magnetic interaction between the magnetic moments of the fluxons can be established. Alternatively, a qubit with a periodic potential well can generate Bloch zones of a fluxon moving as a quantum particle in the periodic potential.

An array of qubits can be initialized by controlling the bias current through the junction and the magnetic field applied to the junction. The quantum state of the qubits will then evolve in a fashion predicted by the appropriate Hamiltonian, performing the requested quantum computation in the process. The result of the quantum computation can then be read-out by determining the location of the fluxon in each qubit of the array.

These and other embodiments are further discussed below with reference to the following figures.

SHORT DESCRIPTION OF THE FIGURES

Figure 1A:
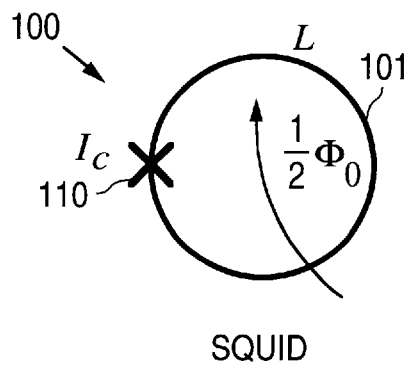
FIGS. 1a and 1b show a SQUID type qubit and a potential energy profile for a magnetic flux on the SQUID type qubit, respectively.
Figure 1B:
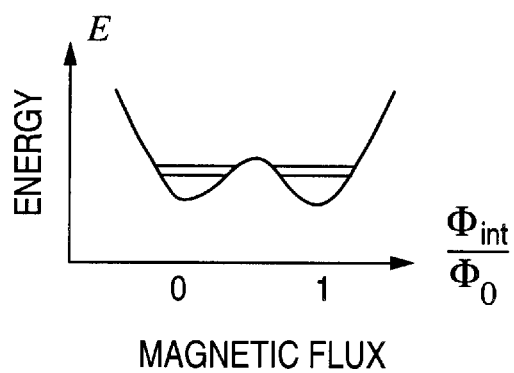
Figure 2A:
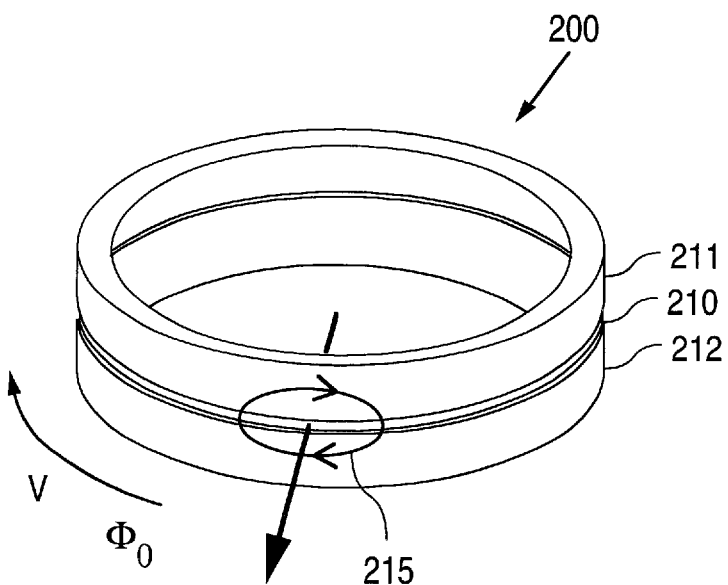
FIG. 2a shows an annular long Josephson junction with a trapped fluxon.
Figure 2B:
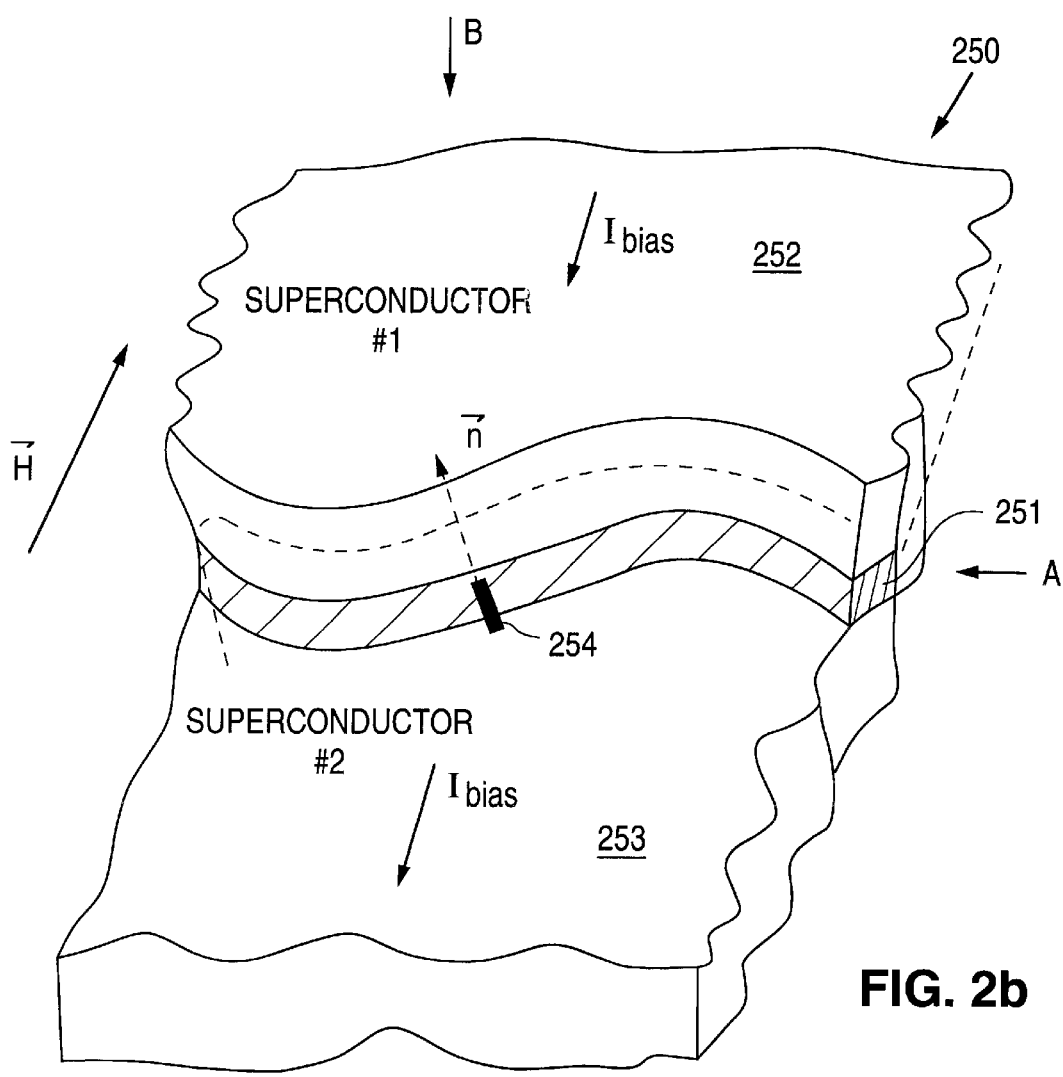
Figure 2C:
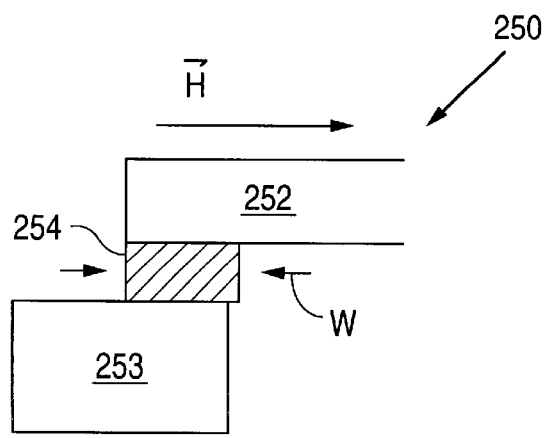
Figure 2D:
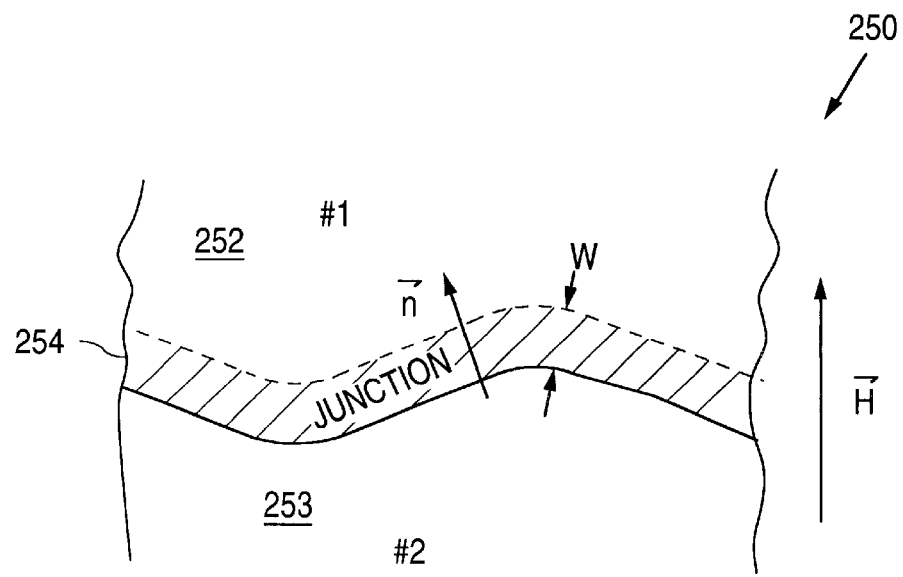

FIGS. 2b, 2c, and 2d show a general shaped long Josephson junction with a fluxon, a plan view of the junction, and a cross-sectional view of the junction, respectively.

Figure 2E:
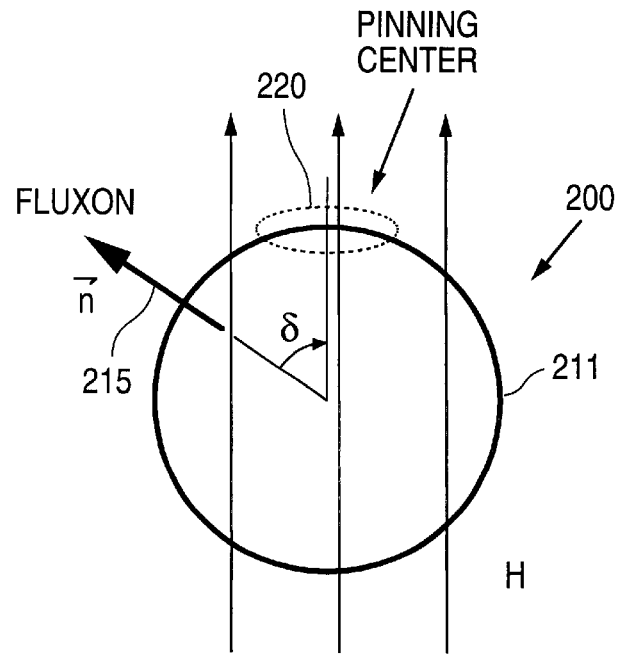

FIG. 2e shows a plan view of an annular long Josephson junction with a trapped fluxon.

Figure 2F:
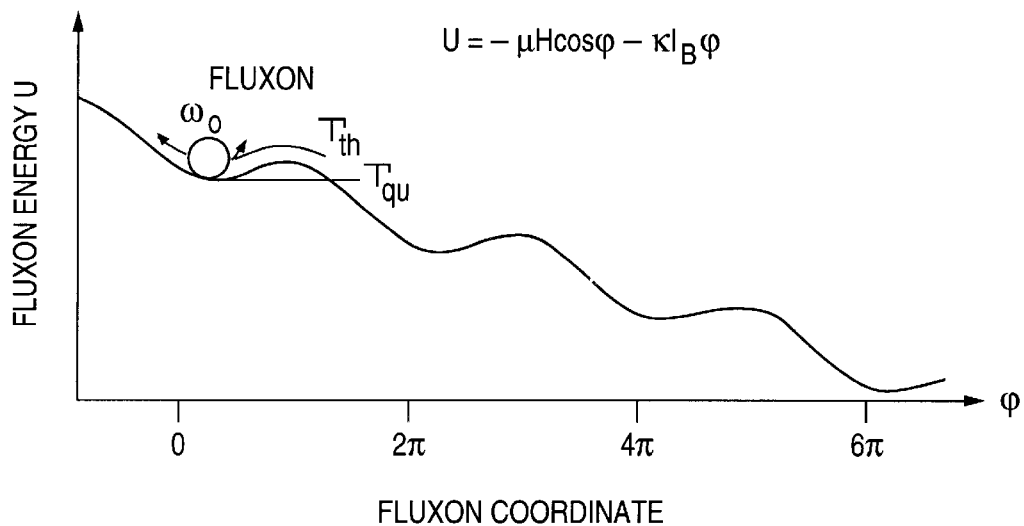

FIG. 2f shows a wash-board potential energy function of the fluxon in an annular long Josephson junction.

Figure 3A:
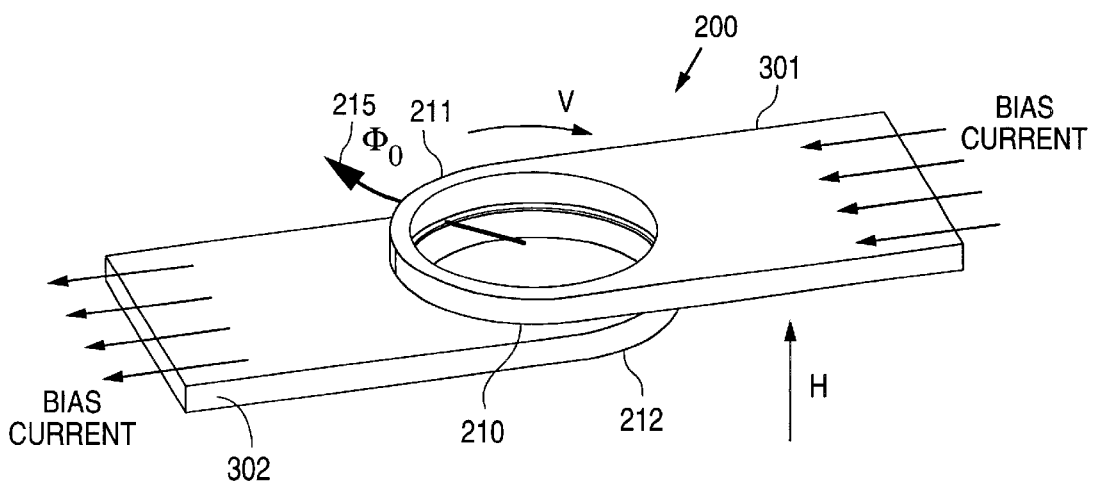

FIG. 3a shows a standard geometry for implementing an annular long Josephson junction.

Figure 3B:
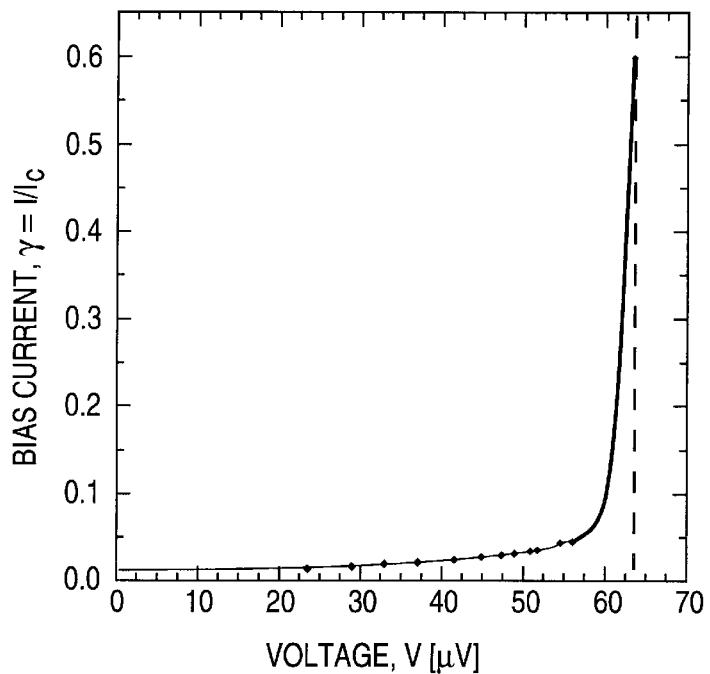

FIG. 3b shows a typical I-V curve for a fluxon in an annular long Josephson junction.

Figure 3C:
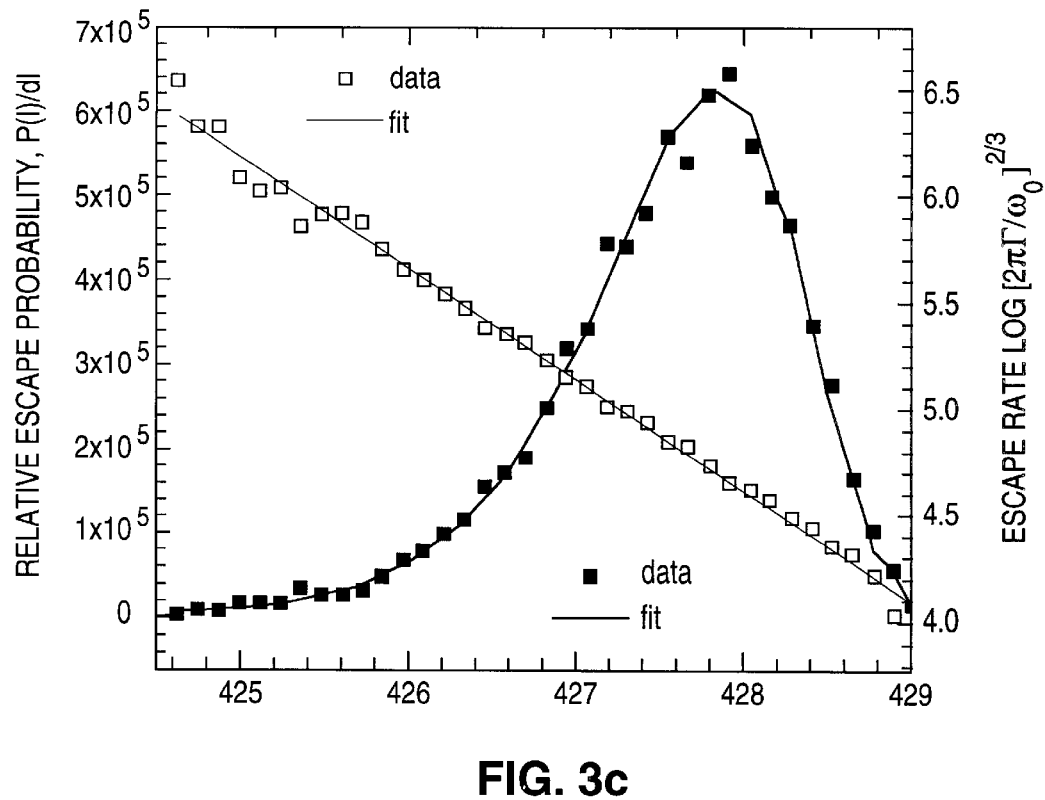

FIG. 3c shows a typical thermal activation curve for a fluxon in an annular long Josephson junction.

FIG. 4a shows a qubit according to an embodiment of the present invention, the qubit being a heart-shaped long Josephson junction.

FIG. 4b shows a plan view of the heart-shaped long Josephson junction shown in FIG. 4a.

FIG. 4c shows a potential energy function of a fluxon in a heart-shaped long Josephson junction shown in FIG. 4a.

Figure 4D:
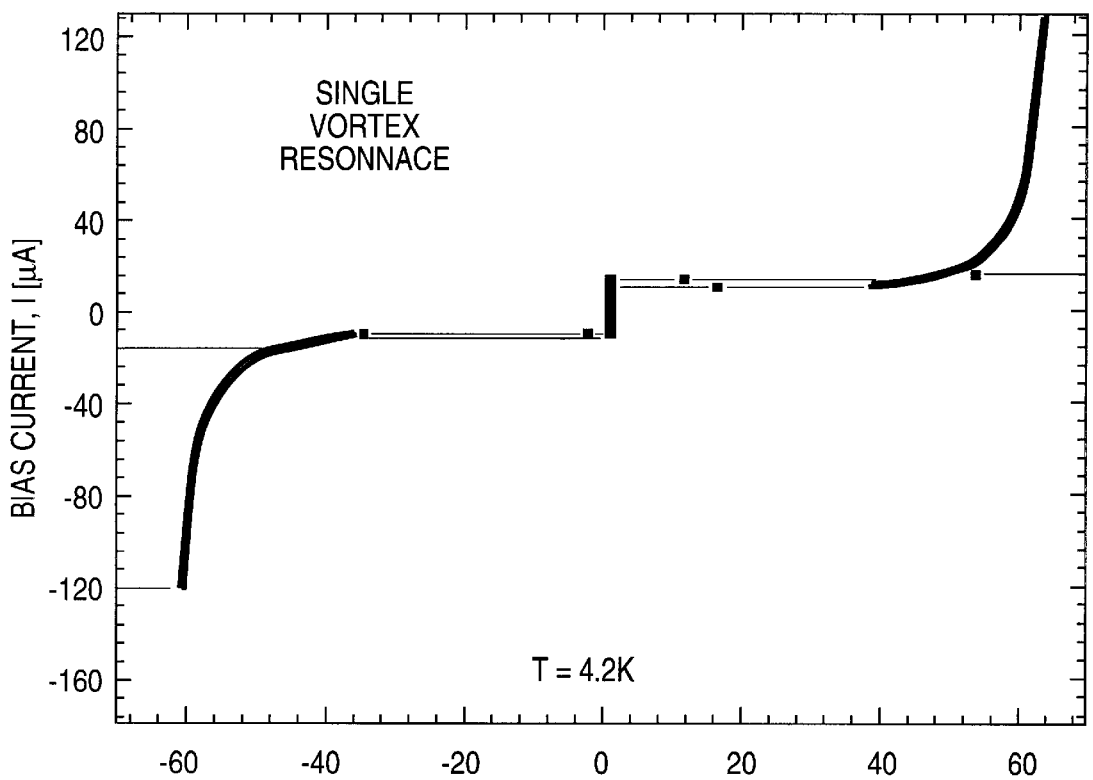

FIG. 4d shows an I-V curve for a fluxon in a heart-shaped long Josephson junction.

Figure 4E:
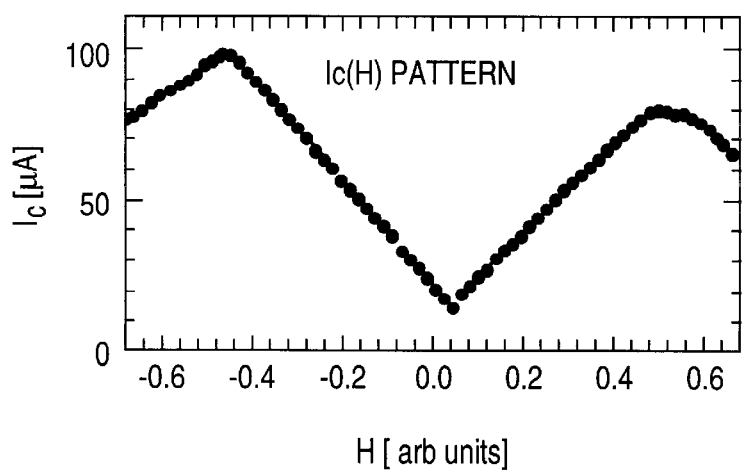

FIG. 4e shows an asymmetric dependence of the critical current on applied magnetic field in a heart-shaped long Josephson junction.

Figure 4F:
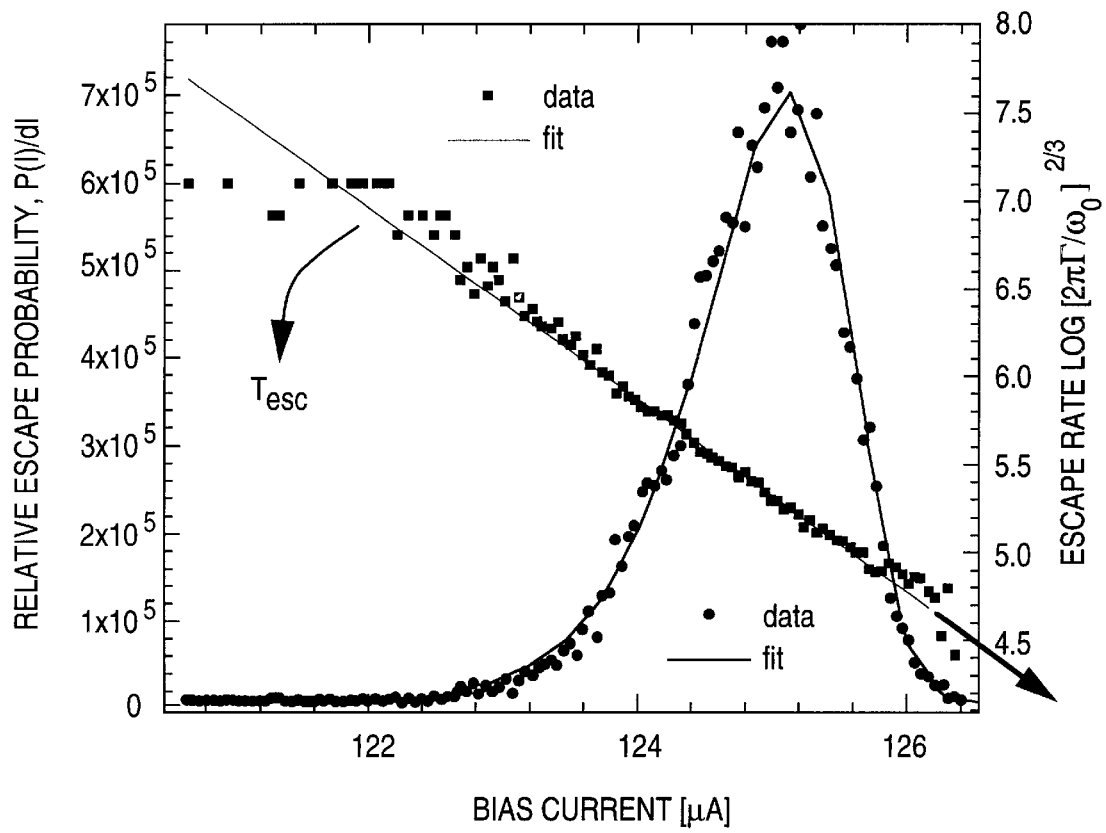

FIG. 4f shows a thermal activation curve for a heart-shaped Josephson junction.

FIG. 5a shows a plan view of a qubit according to another embodiment of the present invention, which is a sine-shaped long Josephson junction.

FIG. 5b shows a potential energy function of a fluxon on a sine-shaped long Josephson junction according to an embodiment of the present invention.

FIG. 5c shows a qubit according to the present invention having an S-shaped long Josephson junction.

FIG. 5d shows a qubit according to the present invention having an M-shaped long Josephson junction.

Figure 6B:
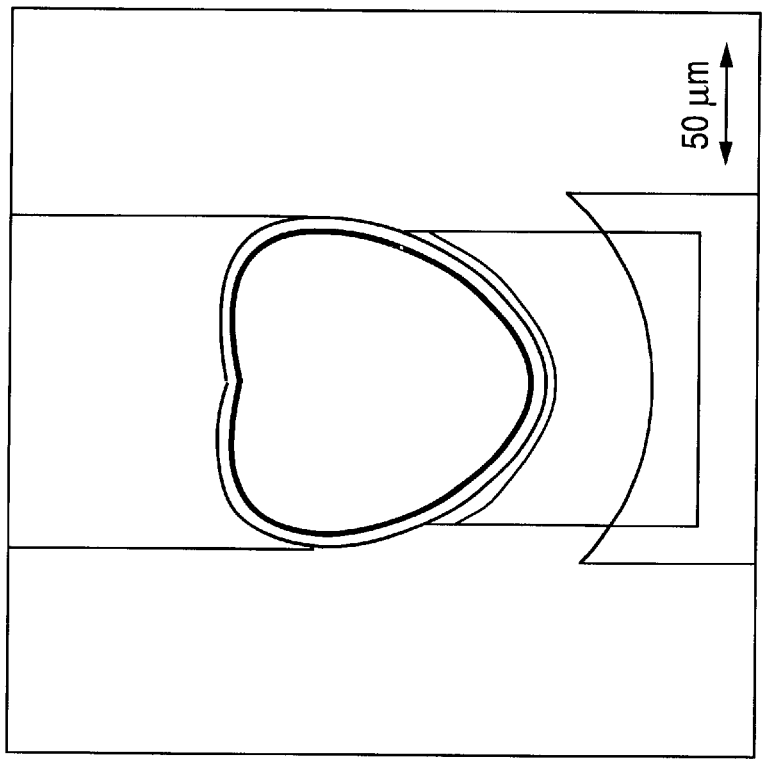
Figure 6A:
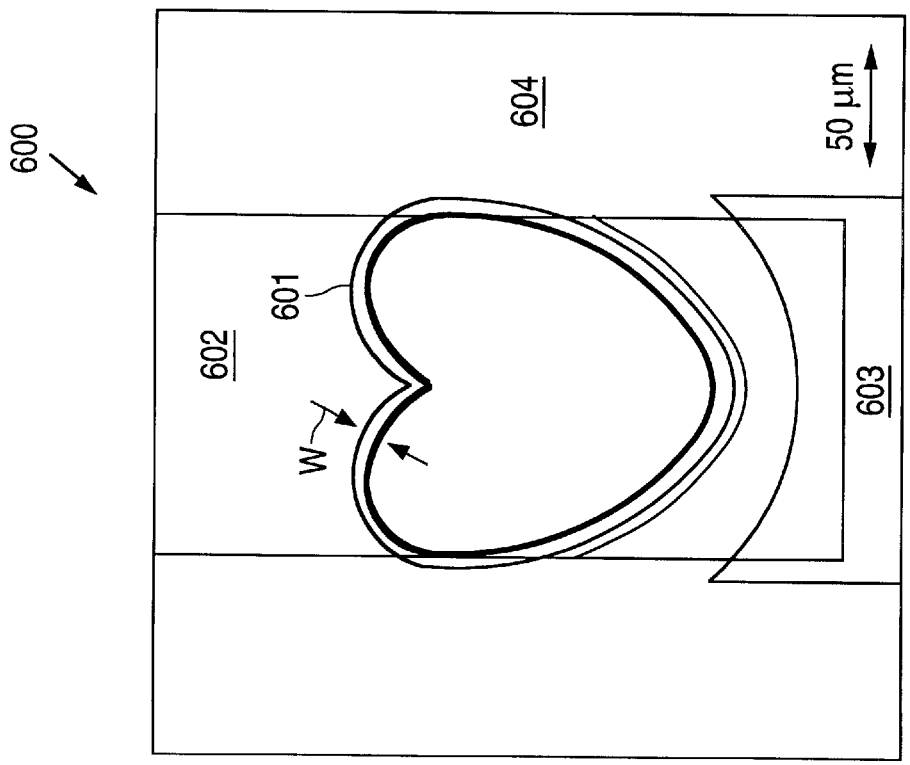

FIGS. 6a and 6b show embodiments of qubits in the form of heart-shaped long Josephson junctions according to the present invention.

Figure 7B:
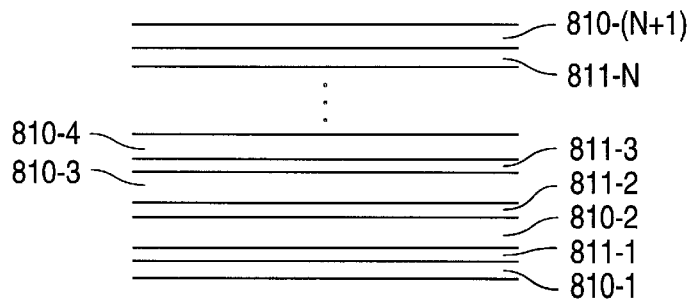
Figure 7A:
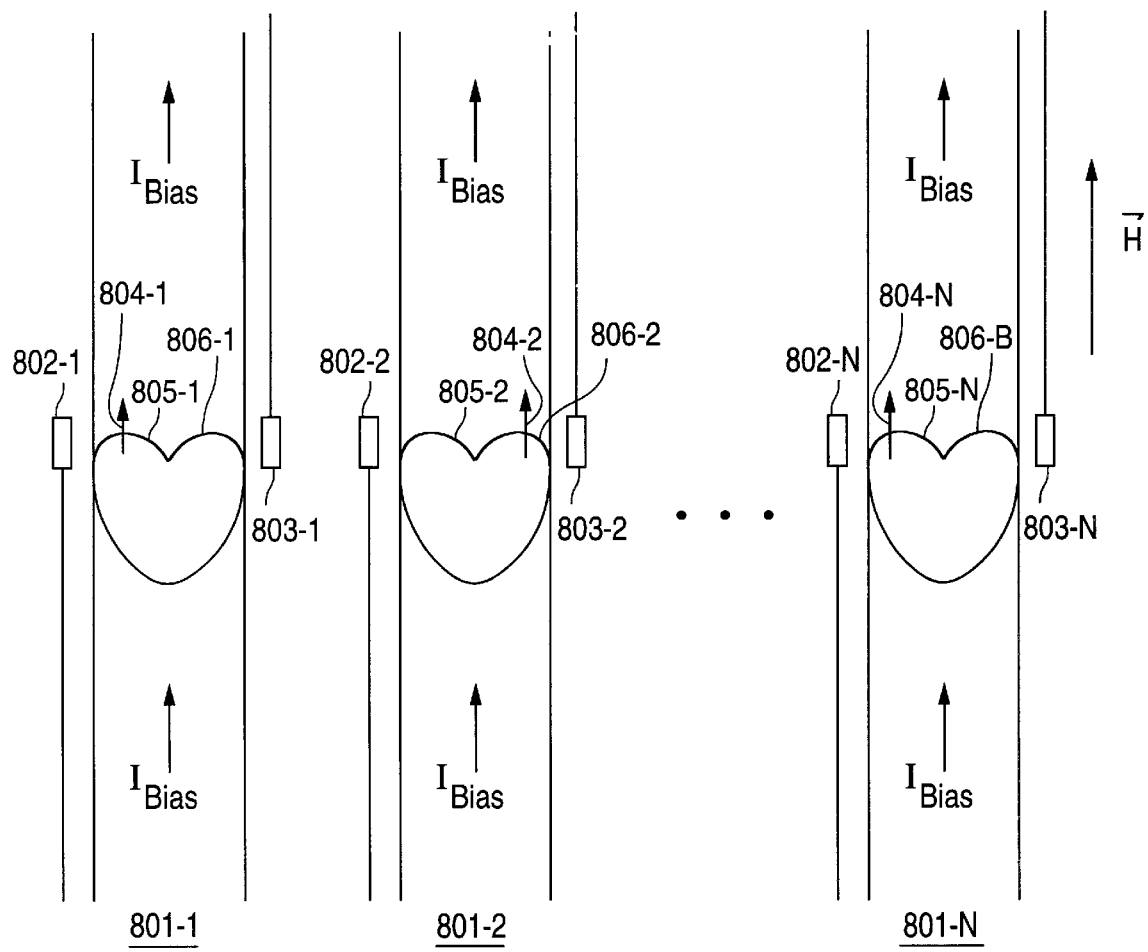

FIG. 7a shows an array of qubits formed from shaped long Josephson junctions according to the present invention arranged in a plane.

FIG. 7b shows a cross-section of an array of qubits including a stacked shaped long Josephson junction Elements having the same designation in different figures have the same or similar functions.

DETAILED DESCRIPTION

FIG. 2a shows a structure 200 having a long annular Josephson junction 210. Josephson junction 210 is formed by an annular superconductor 211 separated from another annular superconductor 212 by a dielectric. A fluxon 215 having magnetic moment $\vec{n}$ is shown trapped in the junction 210.

FIG. 2b shows a general structure 250 having a long Josephson junction 251 separating superconductors 252 and 253. A fluxon 254 is shown trapped on structure 250. Structure 200 is a special case of structure 250. FIG. 2c shows a cross-sectional view of structure 250. FIG. 2d shows a planar view of structure 250.

The superconducting phase difference $\phi$ across long Josephson junction 251 is described by the perturbed sine-Gordon equation $$\phi_{xx} - \phi_{tt} = \sin\phi + \alpha\phi_t - \beta\phi_{xxt} - \gamma - f(x,t), \quad (1)$$

where x and t are normalized time and space coordinates. The space coordinate x, describing the location on junction 251, is normalized to the Josephson penetration depth $\lambda_J$ and the time t is normalized to the inverse plasma frequency $\omega_P^{-1}$. The parameter $\alpha$ is the dissipation coefficient due to the quasiparticle tunneling across the tunnel barrier at the junction, $\gamma$ is the bias current density normalized to the critical current density $J_c$ of the junction ($I_{bias}/I_c$), $\beta$ is the surface loss coefficient, and f(x,t) is a function of x and t which is related to the contribution of the potential energy function of fluxon 254 from influences external to structure 250 (e.g., an externally applied magnetic field $\vec{H}$). The notation $\phi_z$ is a short hand notation for the partial derivative of $\phi$ with respect to $$z\left(\frac{\partial\varphi}{\partial z}\right),$$

where z represents x or t. Therefore, $\phi_{xx}$, $\phi_t$, $\phi_{tt}$, and $\phi_{xxt}$ are the respective partial derivatives of $\phi$ with respect to the indicated subscripts.

Fluxon 254 accounts for a solitary wave solution of the non-perturbed sine-Gordon equation ($\alpha=0$, $\beta=0$, $\gamma=0$, and f(x,t)=0), yielding a quantum of phase difference given by $$\varphi_0 = 4\arctan\left[\exp\frac{x-q(t)}{\sqrt{1-u^2}}\right], \quad (2)$$

where q(t) is the position of fluxon 254 as a function of time and u is the velocity of fluxon 254.

The dissipation parameters $\alpha$ and $\beta$ can be made very small at low temperature by using a high-quality tunnel barrier for function 251. The parameters $\alpha$ and $\beta$ are dependent on the material properties of junction 251 and can be made vanishingly small by controlling the processing that results in structure 250. In an Nb/Al—AlO$_x$/Nb junction, $\alpha$ is about $10^{-2}$ at a temperature of about 4.2 K and decreases exponentially with temperature. The parameter $\gamma$ can be made vanishingly small by controlling the bias current $I_{bias}$ through junction 251.

Junction 251 can be viewed as a quasi-one-dimensional system if the width, W, of junction 251 is smaller than the Josephson penetration depth $\lambda_J$. As an example, in one embodiment further discussed below the width of the junction W is about 0.3 $\mu$m while the Josephson penetration depth $\lambda_J$ is about 30 $\mu$m. Since the magnetic flux in a superconductor is quantized, fluxon 254, a particle-like object having one quantum of magnetic flux, is a topologically stable particle-like object governed by the equation of motion $$m\ddot{q} + \alpha\dot{q} + \frac{\partial U(q)}{\partial q} = 0, \quad (3)$$

where m is the fluxon "mass" and q is the fluxon's coordinate. The potential U(q) depends on a bias current across junction 251 and an external magnetic field $\vec{H}$ applied in the plane of the tunnel barrier. FIG. 3a, for example, shows an embodiment of structure 200 having a first conductor 301 coupled to conductor 211 and a second conductor 302 coupled to conductor 210. In FIG. 3a, conductor 211 is formed in conductor 301 and conductor 210 is formed in conductor 302. Fluxon 215 is trapped in junction 210. A bias current $I_{bias}$ passes from conductor 301 through junction 210 and through conductor 302. A magnetic field $\vec{H}$ is applied in the plane of junction 210.

In spite of the well-known fact that a fluxon carries the magnetic flux quantum $\Phi_0$, its dynamics are governed by equations of purely classical mechanics as seen in Equation 3. Fluxons are predicted to behave as essentially quantum particles only under special conditions, for example at low temperatures and under specific junction parameters ranges. In particular, the fluxon mass m can be reduced by decreasing the junction width W. For a junction width of about 1 $\mu$m the quantum effects (such as, e.g., quantum tunneling) are expected to dominate at temperatures below about 50 mK. Quantum fluxons have been first studied theoretically by Hermon et al. (See Z. Hermon, A. Stern, and E. Ben-Jacob, Phys. Rev. B 49, 9757 (1994); Z. Hermon, A. Shnirman, and E. Ben-Jacob, Phys. Rev. Lett. 74, 4915 (1995)) who investigated the internal dephasing of a quantum fluxon via the interaction with thermally generated Josephson plasmons. At low temperatures (below about 1 K), the estimated dephasing length of the fluxon is much longer than the fluxon size. This result is rather optimistic for experimental observation of quantum properties of fluxons. The role of Josephson plasmons in macroscopic quantum tunneling (MQT) was further studied by Shnirman et al. (See A. Shnirman, E. Ben-Jacob, and B. Malomed, Phys. Rev. B 56, 14677 (1997)). Shnirman et al. found that virtual processes involving plasmon emission and absorption does not alter essentially the tunneling probability and concluded that macroscopic quantum tunneling of fluxons can be observed.

Kato and Imada (See T. Kato and M. Imada, J. Phys. Soc. Japan 65, 2964 (1996)) theoretically studied MQT of a fluxon pinned in a potential well. Their calculations show that for a junction width of 1 $\mu$m the temperature of the crossover from the thermally activated regime to the quantum tunneling regime is about 50 mK. Kato and Imada also took into account dissipation effects due to quasiparticle tunneling using the Caldeira-Leggett approach. The dissipation yields a correction that reduces the tunneling rate slightly, i.e., by about 20%. Their conclusion was that observation of MQT of a fluxon seem attainable with presently available micro-fabrication techniques producing long Josephson junctions with sufficiently small widths. Moreover, Kato and Imada performed the analysis of the two-state system (with a double-well potential formed by two fixed micro-resisters positioned in the junction) and states that "from the estimate for dissipation coefficients due to quasiparticle tunneling, the observation of the macroscopic quantum coherence appears to be possible." Id.

Fluxons moving in a magnetic field-induced potential in annular long Josephson junctions have been studied in, for example, A. V. Ustinov, B. A. Malomed, N. Thyssen, "Soliton Trapping in a Periodic Potential: Experiment," Phys. Lett. A 233, 239 (1997), herein incorporated by reference in its entirety; A. V. Ustinov, "Observation of a Radiation-Induced Soliton Resonance in a Josephson Ring," JETP Lett., Vol. 64, No. 3, 191 (1996), herein incorporated by reference in its entirety; and A. Ustinov, B. Malomed, E. Goldobin, "Backbending Current-Voltage Characteristic for an Annular Josephson Junction in a Magnetic Field," Phys. Rev. B, Vol. 60, No. 2, 1365 (1999), herein incorporated by reference in its entirety.

As discussed previously, FIGS. 2b, 2c, and 2d show a general structure 250 having a Josephson junction 251 between superconductors 252 and 253. Fluxon 254, having magnetic moment $\vec{n}$, is shown trapped on junction 251. Structure 250 is placed in external magnetic field $\vec{H}$. The magnetic field $\vec{H}$ interacts with fluxon 254 as with a magnetic dipole having magnetic moment $\vec{n}$. The interaction energy, then, is given by $$U_{int} \propto -(\vec{H} \cdot \vec{n}). \tag{4}$$

As shown in FIGS. 2b and 2d, moment $\vec{n}$ is directed perpendicular to the junction line (i.e., the path of conductors 252 and 253) and lies in the plane of the junction. As is also shown in FIGS. 2b, 2c, and 2d, the external magnetic field $\vec{H}$ is applied in the plane of junction 251.

FIG. 2e shows a planar view of the long annular Josephson junction shown in FIG. 2a. As shown in Equation 4, $U_{int} \propto -Hn\cos\delta$ and therefore is at a minimum where $\vec{n}$ is directed along $\vec{H}$ and at a maximum where $\vec{n}$ is opposite to $\vec{H}$. It has been shown theoretically (See N. Groenbech-Jensen, P. S. Lomdahl, and M. R. Samuelsen, Phys. Rev. B 43, 12799 (1991)) and verified experimentally (See A. V. Ustinov, JETP Lett. 64, 191 (1996)) that this case is described by setting $f(x,t)=h\sin 2\pi x/L$ so that Equation 1 becomes $$\varphi_{xx} - \varphi_{tt} = \sin\varphi + \alpha\varphi_t - \gamma - h\sin\left(\frac{2\pi x}{L}\right), \tag{5}$$

where L is given by $L=\pi D/\lambda_J$, D is the diameter of annular long Josephson junction 210, and neglecting the surface loss term $\beta$. The last term in Equation 5 accounts for the coupling between the externally applied field and the flux density of fluxon 254 in junction 210. The dimensionless amplitude $h \propto H$ is the external magnetic field normalized by a geometrical factor. The solution to Equation 5 is subject to the boundary conditions $$\phi(L)=\phi(0)+2\pi, \phi_x(L)=\phi_x(0).$$

The fluxon potential energy in an annular junction considering both the interaction with an external magnetic field and the effects of a bias current $I_{bias}$, is $$U(q) = -2\pi\gamma q - 2Lh\cos\left(\frac{2\pi q}{L}\right)\cosh^{-1}\left(\frac{\pi^2}{L}\right). \tag{6}$$

Thus, the fluxon dynamics in the annular junction placed into an external magnetic field is analogous to the motion of a particle in a tilted washboard potential where the tilt is mediated by the bias current $I_{bias}$ as shown in FIG. 2d, where $\phi=(2\pi q/L)$. The minima of $U(q)$ correspond to the single pinning location on the annular long junction 210.

Under the influence of a bias current, $\gamma=I_{bias}/I_c$, fluxon 215 (FIG. 3a) will travel with velocity v around annular junction 211. The moving fluxon 215 generates a voltage V that is proportional to the velocity v. FIG. 3b shows an I-V curve characteristic of a fluxon trapped on an annular Josephson junction structure 200. The data shown in FIG. 3b was taken with an annular long Josephson junction having width about 3 $\mu$m, radius of about 50 $\mu$m, and critical current density of about $j_c$=300A/cm$^2$.

A fluxon trapped in a potential well can also escape by thermal activation or by quantum tunneling. The thermal activation rate is given by $$\Gamma_{th} = \frac{\omega_0 \omega_p}{2\pi}\exp\left(\frac{-U_0 E_0}{k_B T}\right), \tag{7}$$

where $\omega_0$ is the normalized characteristic small amplitude oscillation frequency of the fluxon at the bottom of the potential well. The potential barrier height in normalized units $U_0$ and the attempt frequency $\omega_0$, both dependent on the bias current, are calculated from the general equation for $U(q)$ determined from the solution of Equation 5. $E_0$ is the rest energy of the fluxon, typically given by $E_0=\Phi_0 j_c \lambda_J W/(2\pi)$. FIG. 3c shows a typical graph of the normalized thermal activation rate and the calculated probability distribution for an annular Josephson junction having junction width 3 $\mu$m and radius of about 50 $\mu$m at T=6.0 K and externally applied field strength H=0.25 Oe.

The quantum tunneling of the fluxon can be described in the Caldeira-Leggett approach, where the escape rate is given by $$\Gamma_{qu} = A \exp(-B) \quad (8)$$

where $$A = \sqrt{60}\, \omega_0 \omega_p \left(\frac{B}{2\pi}\right)^{1/2} (1 + O(\alpha)) \text{ and} \quad (9)$$

$$B = \frac{36 U_0 E_0}{5 \hbar \omega_0 \omega_p} (1 + 1.74\alpha + O(\alpha^2)). \quad (10)$$

These characteristics are further discussed in A. Wallraff, Yu. Koval, M. Levitchev, M. V. Fistul, and A. V. Ustinov, J. Low Temp. Phys., Vol. 118, Nos. 5/6, 543 (2000), herein incorporated by reference in its entirety.

A cross-over from thermal activation dominating the escape of fluxons from the quantum well to quantum tunneling dominating the escape of fluxons can be expected at temperatures T about 20 mK for annular long Josephson junctions with several microns of width. This cross-over temperature can be increased close to about 100 mK with sub-micron junctions widths.

As shown in FIG. 2e, annular long Josephson junction 200 discussed above has a single pinning location corresponding to the minima in the potential energy function where the magnetic moment of fluxon 215 is aligned in the plane of junction 211 with externally applied magnetic field $\vec{H}$. In order to form a standard quantum computing qubit, the structure should exhibit at least two pinning locations on the qubit structure. In other words, in order to form a quantum computing qubit a fluxon on the qubit must have at least a double-welled potential energy function. A qubit according to the present invention is formed from a shaped long Josephson junction.

Pinning forces, resulting in pinning locations, may have various physical sources. Pinning locations in long Josephson junctions can be formed by introducing micro-shorts or micro-resistors within the junction. Pinning locations may also be created by interactions between the fluxon and the junction leads or by interactions between the fluxons and parasitic magnetic flux trapped in the superconducting films. However, pinning locations created by interactions between the fluxons and external magnetic fields are controllable.

As is seen above, the shape of the junction specifically determines the interaction energy U(q). Therefore, by varying the junction geometry it is possible to design structures, at least in principle, with an arbitrarily shaped fluxon potential U(q). In particular, a qubit utilizing macroscopic quantum coherence (MQC) should have at least a double welled potential. Discussions of shaped Josephson junctions are presented in A. Wallraff, Y. Koval, M. Levitchev, M. Fistul, A. V. Ustinov, "Fluxons in sub-Micron Wide Long Josephson Juctions"Conference on "Electron Transport in Mesoscopic Systems," Gothenburg, Sweden, Aug. 12–15, 1999.

FIG. 4a shows an embodiment of a qubit 400 according to the present invention having a long "heart" shaped Josephson junction 401. Qubit 400 includes superconductors 402 and 403 separated to form junction 401. The lobes at locations 406 and 407 can be oriented in any direction. If they are not oriented symmetrically with respect to the direction of bias current $I_{bias}$, then γ may be dependent on the coordinate in the junction 401.

As can be seen from Equation 4, the magnetic portion of the energy potential is at a minimum when the magnetic moment $\vec{n}$ of a fluxon trapped on junction 401 aligns with the externally applied magnetic field $\vec{H}$. As shown in FIG. 4B, a magnetic field $\vec{H}$ applied in the plane of junction 401 can produce magnetic energy potential minima at pinning points 406 and 407. A third minimum at position 409 is avoided by making the edge between lobes sharp enough, i.e. with a radius much smaller than $\lambda_J$.

In some embodiments, the magnetic field and the shape of qubit 400 are arranged so that the potential energy at position 406 is the same as the potential energy at position 407. A symmetric potential energy function is shown in FIG. 4C. In other embodiments, the shape of qubit 400 can be altered so that the minima of one of the two potential wells formed can be lower than the other minima.

As seen from Equation 6, when a bias current $I_{bias}$ is applied through junction 401, a "tilting" of the potential is observed (i.e., another washboard potential with minima positioned at pinning points 406 and 407 is produced). The symmetric potential energy curve shown in FIG. 4C is the magnetic potential energy absent the effects of a bias current.

The potential energy function shown in FIG. 4C is a double-welled potential. The fluxon can be localized (as a classical particle) in a "0" state corresponding to position 406 or a "1" state corresponding to position 407. At these two locations, the fluxon potential energy is at a minimum. The maximum of potential energy, where the magnetic moment $\vec{n}$ of the fluxon is opposite the magnetic field, is found at position 408. Since $\vec{n}$, at any point on the shape of qubit 400, is perpendicular to the shape of qubit 400, for any orientation of magnetic field $\vec{H}$ with respect to qubit 400, the resulting potential energy is proportional to the cosine of the angle between $\vec{n}$ and $\vec{H}$, as seen from Equation 4.

As shown in FIG. 4C, at zero bias current (γ=0), the fluxon potential is symmetric. If structure 400 is decoupled from the environment, and thermal activation (i.e. T) is low and dissipation (i.e. α and β) is low enough, the superposition of the macroscopically distinct symmetric quantum states labeled |0> and |1>, corresponding to the minima in the potential energy at pinning locations 406 and 407, can be observed. The height of the potential barrier between the two minima is controlled by the strength of the externally applied magnetic field. Additionally, the symmetry of the potential energy curve can be modified by applying a bias current $I_{bias}$ or by varying the direction of the externally applied magnetic field $\vec{H}$.

FIG. 4D shows an I-V curve for an example of qubit 400 having a width of 0.3 μm and radius of about 50 μm at a temperature of 4.2 K. FIG. 4E shows a relationship between the critical current $I_c$, the current where fluxon 405 begins to travel, and the applied magnetic field strength. The assymetry in the critical current $I_c$ with applied magnetic field strength is shape induced and can be utilized for reading out the final state of qubit 400. FIG. 4F shows thermal activation rate and probability functions for a heart-shaped long Josephson junction having a 0.3 μm width and radius of about 50 μm at T=4.2 K.

Experiments described in the above referenced papers demonstrate that a fluxon can be trapped in junction 401 of qubit 400 by applying a small bias current across junction 401 while cooling structure 400 through the normal to superconducting state of the superconducting material of superconductors 402 and 403. The preparation of the initial state can be achieved by turning the magnetic field in the plane of junction 401 in order to decrease the potential at one pinning site relative to the other pinning site. The final state of the fluxon can be read by performing an escape measurement from one of the two potential wells or by positioning weakly-coupled SQUID detectors proximate the pinning points of qubit 400.

In operation, a qubit according to the present invention is initialized by trapping a fluxon in the junction and adjusting the direction of the externally applied magnetic field so that the fluxon is pinned on a selected pinning location in the qubit. The potential barrier between the states is then reduced by reducing the strength of the magnetic field, allowing the quantum states of the fluxon to evolve with time. After a desired time, which should be shorter than the decoherence time of the system, the final state is frozen by increasing the strength of the magnetic field. The final state of the fluxon can then be read out by, for example, detecting the fluxon position with SQUID detectors or by measuring the fluxon escape current.

The magnetic moment of the trapped fluxon can be directed either out of or into the interior of the heart-shaped junction 401. Creation of the fluxon can be controlled by the bias current that is applied while crossing over the superconducting transition temperature. In these two cases the operation of the resulting qubit 400 is the same. However, the direction of the magnetic field $\vec{H}$ that controls the energy barrier between the two states is selected appropriately to create the desired double-well potential energy function for the trapped fluxon.

The magnetic field $\vec{H}$ that controls the fluxon potential energy function has to be small enough such that it does not generate extra fluxons (and/or antifluxons) that might penetrate junction 401. The field which induces fluxons penetrating into the junction is known to be the Josephson vortex critical field $H_{c1}$, which is typically of the order of 1 Oe. The magnetic field that is required to create the desired double-well potential energy function for a trapped fluxon is typically one order of magnitude less than of $H_{c1}$.

The heart-shaped long Josephson junction shown in FIGS. 4A and 4B discussed above is only an example of the variously shaped junctions leading to various potential energy functions. In principle, virtually any desired potential energy function can be constructed by varying the shape of the long Josephson junction. Potential energy functions of interest to quantum computing are those that result in two or more pinning locations on the qubit.

FIG. 5A shows another embodiment of a qubit 500 according to the present invention. Qubit 500 creates a spatially periodic potential energy function. Qubit 500 is arranged so that at positions $q_1$ through $q_8$ the magnetic moment of a fluxon, $\vec{n}$, is aligned with the externally applied magnetic field $\vec{H}$. As before (see Equation 4), the potential energy of the fluxon is a minimum where its magnetic moment $\vec{n}$ is parallel with the magnetic field $\vec{H}$. The potential energy of the fluxon is a maximum where the angle between the magnetic moment $\vec{n}$ and the magnetic field $\vec{H}$ is a maximum. FIG. 5B shows the periodic potential energy function experienced by a fluxon on qubit 500.

Further embodiments of qubits according to the present invention include an S-shaped long Josephson junction or an M-shaped Josephson junctions. FIG. 5c shows a plan view of an S-shaped junction 510 and FIG. 5d shows an M-shaped junction 520. In order to realize a symmetric double-welled potential, for S-shaped junction 510 the external magnetic field has to be oriented in the "horizontal" direction, creating pinning points 511 and 512. In M-shaped junction 520 the control field has to be turned in the "vertical" direction, creating pinning points 521 and 523. A pinning location at point 522 can be avoided by making a sharp joint in the center of M-shaped junction 520. The advantage of the S- and M-shaped junctions is that they have open boundaries for the fluxon entrance and do not require fluxon trapping at the superconductor transition temperature. The disadvantage in both cases is possible escape of the fluxon through the junction boundaries and, because of that, a narrower magnetic field and bias current range of the operation may be utilized in these qubits.

A possible constraint on the potentials that can be generated by changing the junction shape is that the shape dependent portion of the potential is effectively averaged over the size of the fluxon, which is proportional to the Josephson penetration $\lambda_J$. Therefore, as the Josephson penetration gets large, the features of the potential energy function that depend on the shape of the junction may disappear.

FIG. 6a shows an embodiment of a qubit 600 having a heart shaped long Josephson junction structure. Qubit 600 has a junction 601 formed between superconductors 603 and 602. Although other materials for forming a Josephson junction may be used, structure 600 is formed with an Nb/Al—AlO$_2$/Nb junction (i.e., superconductors 603 and 602 are Nb). Superconductors 603 and 602 are separated in junction 601 by an Al—AlO$_2$ layer. The width of the Josephson junction in structure 600 is about 0.3 μm, although other embodiments may have any width. The smaller the width of the junction, the higher is the cross-over temperature to the quantum regime. Junction 601 is shown having a radius of about 50 μm, although other embodiments may have radial dimensions in the range from a few to several hundred micrometers, depending on the Josephson penetration depth $\lambda_J$. The diameter of the structure has to be of the order of a few $\lambda_J$. The critical current density $J_c$ of junction 601 is about 100 A/cm$^2$ and consequently the Josephson length $\lambda_J$ is about 30 μm.

In general, a qubit structure according to the present invention can be constructed from any combination of materials that forms a Josephson tunnel junction. Additionally, provided that magnetic fluxon can be trapped in the junction formed and the temperature can be low enough, the junction can have any width.

FIG. 6b shows a similar qubit 610 with a less pronounced heart shape. Qubit 610, therefore, would exhibit a less defined pinning location, i.e. the minima of the potential barrier at the pinning sites is broader and the height of the potential barrier between the two minima will be lower for qubit structure 610 than for qubit structure 600.

A method of forming the ultra-narrow (below 1 μm) long junction structures shown in FIGS. 6a and 6b is discussed in Yu. Koval et al., IEEE Trans. Appl. Supercond., 9 (Proc. of ASC 98, 1999), herein incorporated by reference in its entirety. Shaped long Josephson junctions for qubits according to the present invention, then, can be formed by a standard trilayer Nb/Al—AlO$_x$/Nb Josephson junction fabrication process. A foundry for making such junctions is offered by, e.g., Hypres Inc. (http://www.hypres.com). The chip layout should provide a long Josephson junction shaped in the plane of the substrate. In order to achieve quantum regime at highest possible temperatures (that is most practical for use of the qubit) the junctions with the smallest possible width should be used.

Long Josephson junctions with widths less than about 1 μm, which may be fabricated by the method described by Koval et al., are expected to operate in the quantum regime at temperatures below about 100 mK. In contrast, with conventional 3 µm-wide structures (e.g., routinely fabricated by Hypres Inc., see above) the cross-over temperature is expected to go down to 20–30 mK.

One skilled in the art will recognize that qubits according to the present invention can be constructed using other superconducting materials. Additionally, one skilled in the art will recognize various methods of manufacturing qubits according to the present invention.

FIG. 7a shows an embodiment of an array of qubits 800 according to the present invention. Although array 800 includes heart-shaped qubits 801-1 through 801-N, qubits 801-1 through 801-N may be of any other shape as well. Each of qubits 801-1 through 801-N is shaped to create a potential energy function having pinning locations 805-1 and 806-1 through 805-N and 806-N, respectively. The potential energy functions of each of qubits 801 through 801-N need not be identical. In addition, the lobes of junctions 801-1 through 801-N may not all be oriented symmetrically with respect to any externally applied magnetic field.

As has been previously discussed, fluxons 804-1 through 804-N can be trapped on qubits 801-1 through 801-N, respectively, by application of a bias current through the Josephson junction of qubits 801-1 through 801-N while the temperature is lowered through the superconducting transition temperature. Further, the initial states of fluxons 804-1 through 804-N (i.e., which pinning location 805 or 806 each of fluxons 804 occupies) by rotating the externally applied magnetic field $\vec{H}$ or by adjusting the bias current through the junctions.

Qubits 801-1 through 801-N may be manufactured in close proximity to one another so that pre-determined entanglements between adjoining ones of qubits 801-1 through 801-N are created through magnetic interaction between the trapped fluxons. The entangled qubits can be either placed nearby in the same plane suited with a superconducting groundplane(s) in order to increase the magnetic coupling between the devices, or stacked one on top of another as a Josephson junction stack. The latter case offers the largest possible magnetic coupling between the devices, that increases with decreasing of the thickness of the intermediate superconducting electrode.

FIG. 7b shows an example of a long Josephson junction stack having long junctions 811-1 through 811-N and superconducting layers 810-1 through 810-(N+1). Each of junctions 811-1 through 811-N is a shaped Josephson junction and forms a qubit according to the present invention. Qubit array 800 of FIG. 7a may be formed by qubits that are stacked as well as planar in order to form the desired entanglements.

The final states of each of qubits 801-1 through 801-N can be read out, for example, by detectors 801-1 through 802-N and 803-1 through 803-N. In one embodiments, detectors 801-1 through 802-N and 803-1 through 803-N are weakly-coupled SQUID detectors that determine the location of fluxons 804-1 through 804-N by interaction with the magnetic moments of fluxons 804-1 through 804-N. The resulting state is to be frozen by increasing the externally applied magnetic field. The readout of the resulting state is made by measuring a difference between the magnetic fluxes detected by 801-1 and 802-N, 803-1 and 803-N, etc.

The above discussed examples are exemplary only. One skilled in the art will recognize obvious variations that are intended to be within the scope if this disclosure. Therefore, the invention is limited only by the following claims.

We claim:

1. A superconducting qubit comprising a long Josephson junction having a shape such as to produce a selected potential energy function indicating a plurality of pinning locations for a trapped fluxon in the presence of an externally applied magnetic field.

2. The qubit of claim 1, wherein the shape is heart-shaped.

3. The qubit of claim 2, wherein the externally applied magnetic field is oriented such that lobes of the heart-shaped junction are placed symmetrically with respect to the direction of the externally applied magnetic field in order that the selected fluxon's potential energy function is a symmetric double-well.

4. The qubit of claim 2, wherein lobes of the heart-shaped junction are oriented in the magnetic field so that the fluxon potential energy function is a double-welled potential with one minima having lower energy than the other.

5. The qubit of claim 1, wherein the shape is an S-shape.

6. The qubit of claim 1, wherein the shape is an M-shape.

7. The qubit of claim 1, wherein the shape is a sine-wave.

8. The qubit of claim 7, wherein the junction is oriented in the magnetic field so that the potential energy function is a spatially periodic potential.

9. The qubit of claim 1, wherein the shape is annular.

10. The qubit of claim 9, wherein the plurality of pinning locations are correlated with a plurality of energy levels in a fluxon potential well.

11. A method of initializing and manipulating a shaped long Josephson junction qubit, comprising:

trapping a fluxon in the Josephson junction;

preparing of an initial state of the qubit by adjusting the direction of the externally applied magnetic field so that the fluxon is pinned on a selected one of the pinning locations in the qubit;

switching on a quantum-mechanical superposition of the two states by decreasing the strength of the externally applied magnetic field;

freezing a final state of the qubit after a desired time by increasing the magnetic field; and measuring the final state of the qubit.

12. The method of claim 11, wherein the desired time is less than the decoherence time of the qubit.

13. The method of claim 11, wherein measuring the final state of the qubit includes detecting the location of the fluxon with a SQUID detector.

14. The method of claim 11, wherein measuring the final state of the qubit includes detecting the location of the fluxon by measuring a fluxon escape current.

15. A shaped junction array, comprising:

a plurality of qubits, each of the plurality of qubits comprising a long Josephson junction having a shape such as to produce a selected potential energy function indicating a plurality of pinning locations for a trapped fluxon in the presence of an externally applied magnetic field;

wherein the plurality of qubits are arranged proximate one another so as to create predetermined entanglements between selected ones of the plurality of qubits.

16. The array of claim 15, wherein the shape of at least one of the plurality of qubits is a heart-shape having lobes.

17. The array of claim 15, wherein the shape of at least one of the plurality of qubits is an S-shape.

18. The array of claim 15, wherein the shape of at least one of the plurality of qubits is an M-shape.

19. The array of claim 15, wherein at least two of the plurality of qubits are stacked.

20. The array of claim 15, further including SQUID detectors positioned proximate the pinning locations of each of the plurality of qubits, the SQUID detectors capable of reading the state of the array of qubits.

21. The array of claim 15, wherein the shape of at least one of the plurality of qubits is annular.

22. The array of claim 21, wherein the pinning locations are correlated with a plurality of energy levels in a fluxon potential well.

* * * * *